(12) United States Patent
Yoon et al.

(10) Patent No.: US 7,161,441 B2
(45) Date of Patent: Jan. 9, 2007

(54) HIGH FREQUENCY DISTRIBUTED OSCILLATOR USING COUPLED TRANSMISSION LINE

(75) Inventors: Euisik Yoon, Yuseong-gu (KR); Eun-Chul Park, Yuseong-gu (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 59 days.

(21) Appl. No.: 11/059,701

(22) Filed: Feb. 17, 2005

(65) Prior Publication Data

US 2006/0038623 A1 Feb. 23, 2006

(30) Foreign Application Priority Data

Aug. 17, 2004 (KR) ............ 10-2004-0064614

(51) Int. Cl.
*H03B 5/18* (2006.01)
(52) U.S. Cl. ............ 331/96; 331/107 SL; 331/107 DP; 331/117 D; 331/117 FE
(58) Field of Classification Search ......... 331/107 DP, 331/96, 99, 107 SL, 117 D, 117 FE
See application file for complete search history.

(56) References Cited

U.S. PATENT DOCUMENTS 6,396,359 B1 * 5/2002 Hajimiri et al. ............ 331/96

OTHER PUBLICATIONS

Eun-Chul Park, Euisik Yoon, A 13GHz CMOS Didtributed Oscililator Using MEMS Coupled Transmission Lines for Low Phase Noise, 2004 IEEE International Solid-State Circuits Conference, Feb. 17, 2004, pp. 300-301, San Francisco, CA.

Eun-Chul Park, Jun-Bo Yoon, Songcheol Hong, and Euisik Yoon, A 2.6 GHz Low Phase-Noise VCO Monolithically Integrated with High Q MEMS Inductors, European Solid-State Circuit Conference, 2002, pp. 143-146, Italy.

Bendrik Kleveland, Carlos H. Diaz, Dieter Vook, Liam Madden, Thomas H. Lee, S. Simon Wong, Monolithic CMOS Distributed Amplifier and Oscillator, 199 IEEE International Solid State Circuits Conference, Feb. 15-17, 1999, San Francisco, CA.

Hui Wu and Ali Hajimiri, A 10GHz CMOS Distributed Voltage Controlled Oscillator, IEEE Custom Integrated Circuits Conference, 2000, pp. 581-584, Orlando, FL.

* cited by examiner

*Primary Examiner*—Arnold Kinkead
(74) *Attorney, Agent, or Firm*—Global IP Counselors, LLP

(57) ABSTRACT

The present invention relates to a distributed oscillator, and more particularly, to a high frequency distributed oscillator using coupled transmission lines. According to the present invention, coupled transmission lines capable of increasing the frequency selectivity are used as transmission lines. Signal interference occurs among the coupled transmission lines because of mutual approximation. The coupled transmission lines serve as a filter due to the signal interference. A phase noise characteristic can be thus increased.

9 Claims, 6 Drawing Sheets

US 7,161,441 B2

HIGH FREQUENCY DISTRIBUTED OSCILLATOR USING COUPLED TRANSMISSION LINE

BACKGROUND OF THE INVENTION

1. Field of the Invention

The present invention relates to a distributed oscillator, and more particularly, to a high frequency distributed oscillator using coupled transmission lines.

2. Background of the Related Art

In an oscillation circuit, an oscillator using an inductor and a capacitor as a resonator has been widely used.

In a several GHz bandwidth, however, if a circuit in which an application frequency operates 10 GHz or more is used although not becoming a significant problem in analyzing the circuit, parasitic component or parasitic parameters are generated in the inductor and the capacitor.

That is, capacitance of the capacitor exists in the conductor of the inductor, and inductance component also exists in the plate of the capacitor.

An oscillator is difficult to design so that it operates at a desired frequency and a frequency tuning characteristic is also significantly lowered, because of the parasitic component or parasitic parameters.

There is a disadvantage in that it is difficult to design and implement a passive element due to the parasitic parameters.

Recently, in order to overcome this disadvantage, technology for a distributed oscillator has been proposed.

FIG. 1 is a circuit diagram illustrating the operational principle of a conventional distributed oscillator.

Referring to FIG. 1, the conventional distributed oscillator includes active elements $M_{11}$ to $M_{15}$ respectively having first to third terminals, which are responsible for signal amplification, and transmission lines 111 to 120.

A DC voltage is applied to the transmission line 119, and an output signal is transmitted through the transmission line 120.

The first terminals of the active elements $M_{11}$ to $M_{15}$ are connected between the transmission lines 111, 112, 113 and 114, so that signals are amplified due to the active elements $M_{11}$ to $M_{15}$.

In this time, signals inputted to the second terminals of the active elements $M_{11}$ to $M_{15}$ are transmitted through the transmission lines 115, 116, 117 and 118.

Furthermore, if amplified signals generated from the active elements $M_{11}$ to $M_{15}$ have the same phase, it can be represented as the sum of those amplified signals.

That is, if a signal 131 amplified in the active element $M_{11}$ has the same phase as that amplified in the active element $M_{12}$, they are added to become a summed and amplified signal 132.

As such, if the above process is repeatedly performed between the active elements $M_{11}$ to $M_{15}$, an amplified signal 134 becoming the sum of the signals amplified in the active elements $M_{11}$ to $M_{15}$ is obtained. Consequently, the summed signal 134 is feedbacked to the second terminals of the active elements $M_{11}$ to $M_{15}$, thus forming a distributed oscillator.

Through the above-described construction and operation, the distribution type oscillator is advantageous in that it can operate up to the maximum frequency of oscillation (fmax) of an active element in such a manner that the distributed amplifier is oscillated by feedbacking its output terminal to its input terminal.

However, the distributed oscillator is disadvantageous in that the chip size increases because a ground line has to be formed at both sides of a signal line when designing the distributed oscillator.

SUMMARY OF THE INVENTION

Accordingly, the present invention has been made in view of the above problems occurring in the prior art, and it is an object of the present invention to provide a distributed oscillator in which coupled transmission lines, which can increase the frequency selectivity, are used as transmission lines, wherein signal interference occurs among the coupled transmission lines because of mutual approximation, and the coupled transmission lines serve as a filter at a predetermined frequency due to the signal interference, whereby a phase noise characteristic can be improved.

Another object of the present invention is to reduce the chip size in such a manner that a ground line is formed only at one end of a signal line in designing the coupled transmission lines.

To achieve the above object, according to the present invention, there is provided a high frequency distributed oscillator including transmission lines responsible for frequency selection and signal transmission, transistors for amplifying the signal, and a feedback line for feedbacking the signal that is amplified through the transmission lines and the transistors, wherein the transmission lines use coupled transmission lines capable of increasing the frequency selectivity, signal interference occurs among the coupled transmission lines because of mutual approximation, and the coupled transmission lines serve as a filter at a predetermined frequency due to the signal interference, whereby a phase noise characteristic is improved.

In the above, the coupled transmission lines have two coupling signal lines at their center, and ground lines around it.

Through the above construction, the coupled transmission lines can serve as a filter due to signal interference, and only a predetermined frequency can be selected/amplified. Accordingly, a phase noise characteristic can be improved.

Furthermore, the coupled transmission lines are used, and a ground line is formed only at one end of the coupled transmission line. Thus, it is possible to reduce the chip size compared to a case where the ground lines are formed at both sides of the coupled transmission line.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with preferred embodiments with reference to the accompanying drawings.

Figure 1:
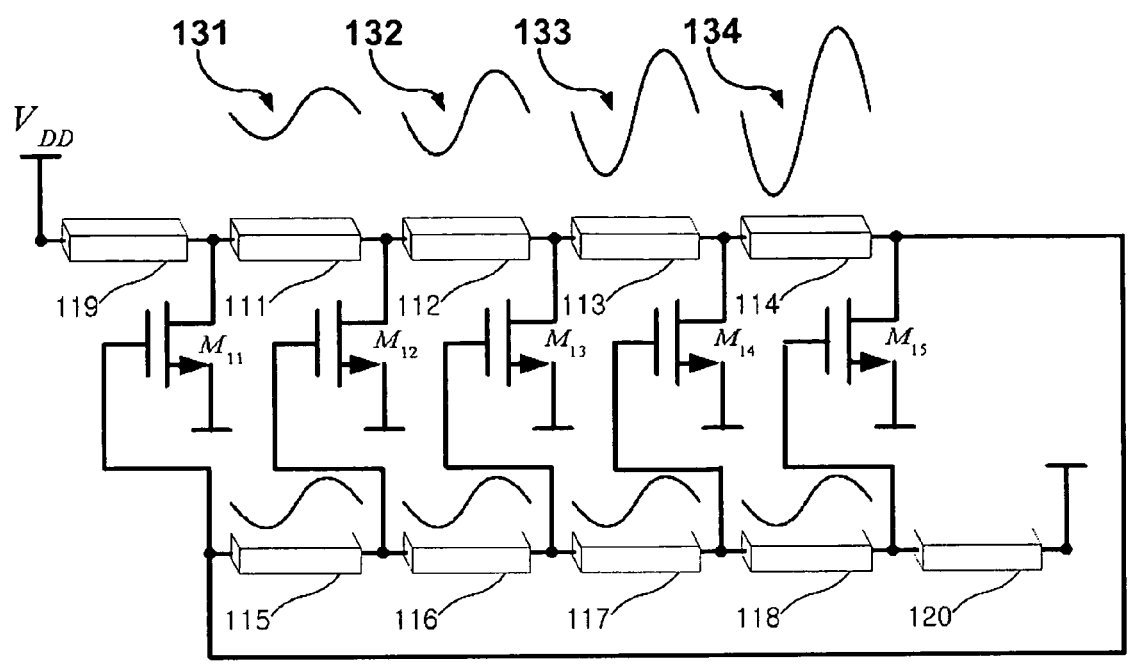
FIG. 1 is a circuit diagram illustrating the operational principle of a conventional distributed oscillator.
Figure 2:
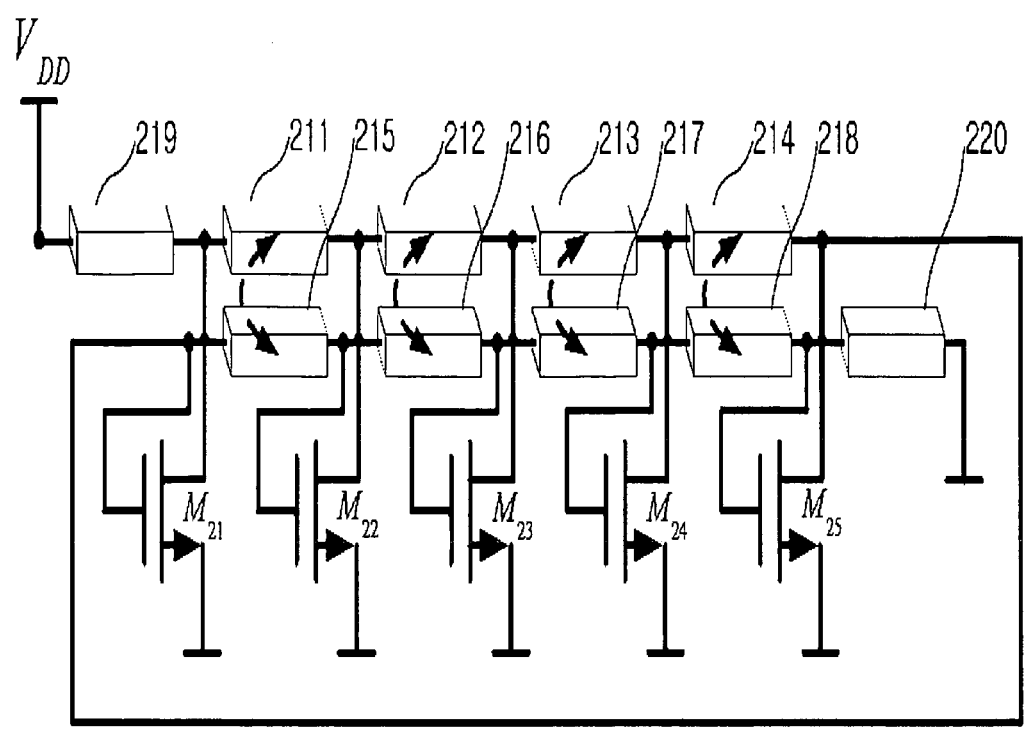
FIG. 2 is a circuit diagram illustrating the operational principle of a coupled type distributed oscillator according to the present invention.

FIG. 2 is a circuit diagram illustrating the operational principle of a coupled type distributed oscillator according to the present invention.

The construction and operation of the coupled type distributed oscillator will now be described with reference to FIG. 2.

Referring to FIG. 2, the coupled type distributed oscillator includes active elements $M_{21}$ to $M_{25}$ respectively having first to third terminals, which are responsible for signal amplification, and coupled transmission lines 211 to 220.

In this structure, the coupled type distributed oscillator according to the present invention employs the coupled transmission lines 211 to 220 so as to increase the frequency selectivity.

Furthermore, the coupled transmission lines 215, 216, 217 and 218 are connected to the input terminals of the active elements $M_{21}$ to $M_{25}$, and the coupled transmission lines 211, 212, 213 and 214 are connected to the output terminals of the active elements $M_{21}$ to $M_{25}$. The coupled transmission lines 211 to 220 and the active elements $M_{21}$ to $M_{25}$ constitute amplifiers, which are in turn connected in series.

A voltage is applied to the transmission line 219, and an output signal is transmitted through the transmission line 220.

The first terminals of the active elements $M_{21}$ to $M_{25}$ are connected between the transmission lines 211 to 214, so that signals are amplified by means of the active elements $M_{21}$ to $M_{25}$.

In this time, signals inputted to the second terminals of the active elements $M_{21}$ to $M_{25}$ are transmitted through the transmission lines 215 to 218.

Furthermore, if amplified signals generated from the active elements $M_{21}$ to $M_{25}$ have the same phase, it can be represented as the sum of those amplified signals.

That is, if a signal amplified in the active element $M_{21}$ has the same phase as that amplified in the active element $M_{22}$, they are added to become a summed and amplified signal.

If this process is repeatedly performed between the active elements $M_{21}$ to $M_{25}$, an amplified signal becoming the sum of the signals amplified in the active elements $M_{21}$ to $M_{25}$ is obtained.

In this time, the summed signal is feedbacked to the second terminals of the active elements $M_{21}$ to $M_{25}$, thus forming the coupled type distributed oscillator.

Through this construction, the coupled type distributed oscillator has characteristics in which the transfer of a signal is prohibited in a range exceeding a resonant frequency and a phase is rapidly changed in the resonant frequency, in such a way that it is oscillated by feedbacking its output terminal to its input terminal.

Furthermore, in a common circuit, in order to reduce mutual interference among neighboring signals, the signal lines are sufficiently spaced apart from one another. If the mutual interference is employed in coupled type distributed oscillators, however, it is possible to increase the selectivity in a particular frequency.

In this case, if the coupled transmission lines are used in the distributed oscillator, phase noise can be reduced due to the characteristic.

Moreover, when the coupled type distributed oscillator is fabricated, the ground line is formed only at one end of the signal line. Thus, the coupled type distributed oscillator of the present invention has the chip size, which is 30% smaller than that of the conventional oscillator assuming that they operate in the same frequency.

In addition, the coupled type distributed oscillator according to the present invention is fabricated by using low-temperature surface micro machining technology at a low temperature of 120° C. through the introduction of micro electro mechanical systems (MEMS) technology. Accordingly, the present invention can present a good device manufacturing process, which can be compatible with a conventional CMOS process.

Figure 3:
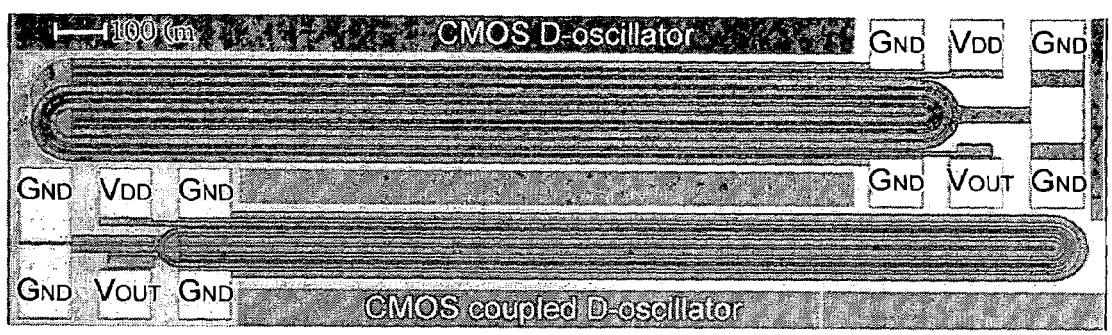
FIG. 3 shows a photography of an actually fabricated chip of a distributed oscillator shown in FIG. 1 and a coupled type distributed oscillator shown in FIG. 2.

FIG. 3 shows two distributed oscillators fabricated by means of the same process.

Referring to FIG. 3, a circuit at the top is a conventional distributed oscillator, and a circuit at the bottom is a coupled type distributed oscillator according to the preset invention.

From FIG. 3, it can be seen that the circuit at the top has the size of 0.3 mm$^2$ (excluding a 1.5 mm×0.2 mm pad), and the circuit at the bottom has the size of 0.2 mm$^2$ (excluding a 1.5 mm×0.13 mm pad).

Moreover, it can be seen that the chip size of the coupled type distributed oscillator according to the present invention is about 30% smaller than that of a conventional distributed oscillator.

Figure 4:
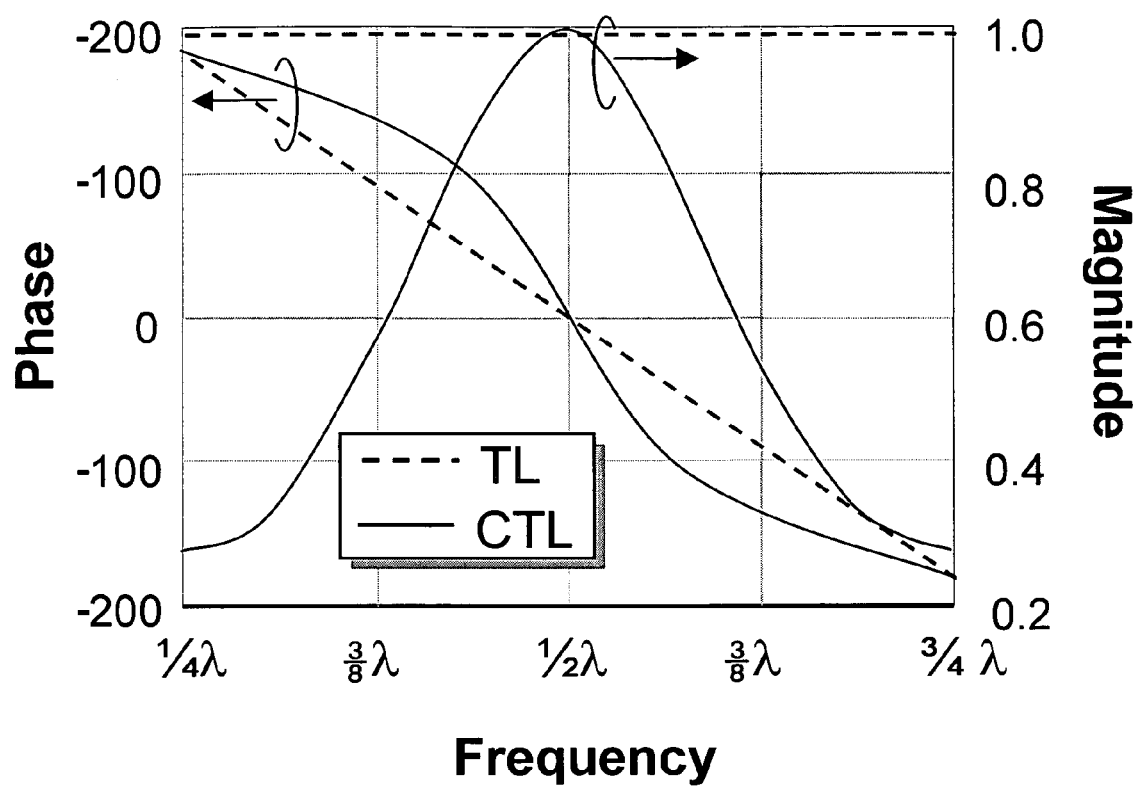
FIG. 4 is a graph showing a phase characteristic depending on a frequency of a coupled transmission line.

FIG. 4 is a graph showing a frequency characteristic of the coupled transmission line used in the present invention.

Referring to FIG. 4, solid lines indicate a frequency response of the coupled transmission lines according to the present invention, and dotted lines designate a frequency response of a conventional transmission line.

From FIG. 4, it can be seen that the conventional transmission line has the same signal output over the whole frequency band, whereas the coupled transmission line of the present invention has a maximum signal output at an oscillating frequency.

This means that oscillation other than the oscillating frequency is prohibited.

It can be also seen that at the oscillating frequency, a phase shift characteristic more abruptly occurs in the coupled transmission line of the present invention than in the conventional transmission line.

This means that the coupled type distributed oscillator according to the present invention has the frequency selectivity, which is higher than that of the conventional transmission line.

Figure 5:
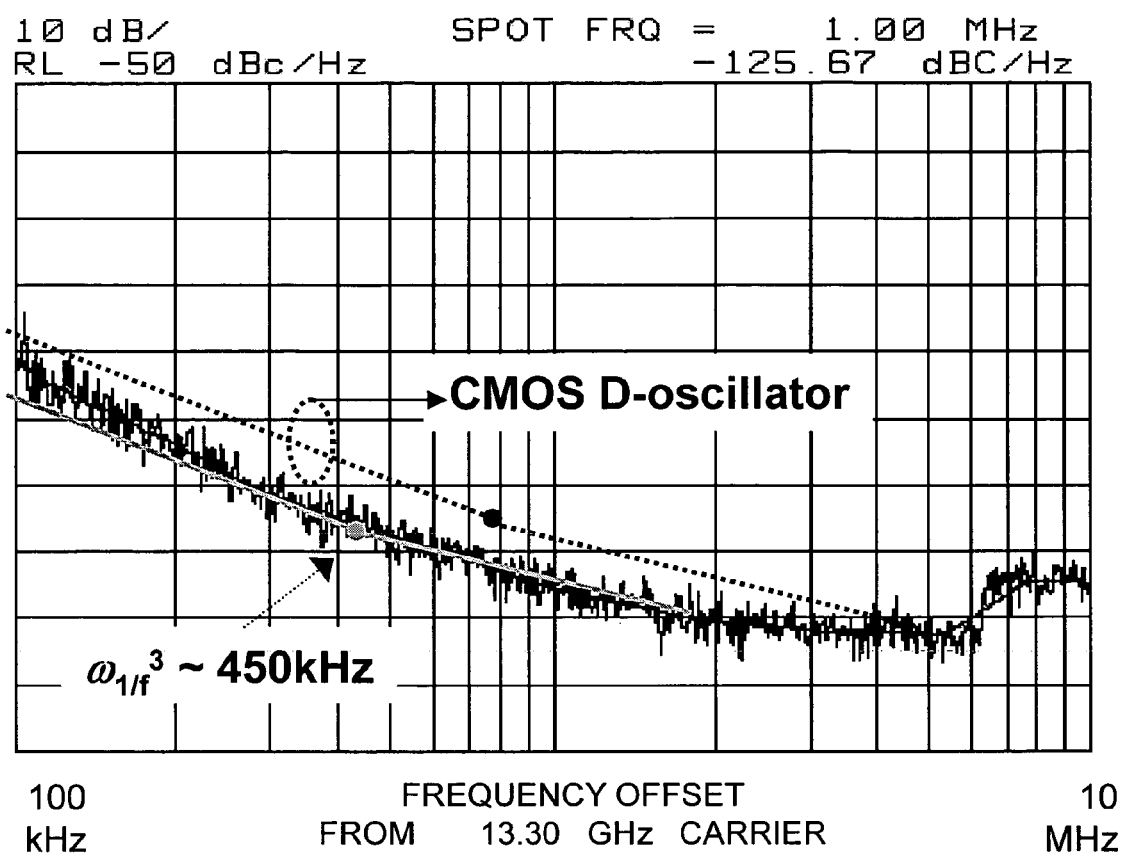
FIG. 5 is a graph showing a phase noise characteristic of the coupled type distributed oscillator according to the present invention.

FIG. 5 is a graph showing a phase noise characteristic of the coupled type distributed oscillator according to the present invention.

Referring to FIG. 5, it can be seen that in the case where the oscillating frequency is about 13 GHz, a conventional distributed oscillator has a phase noise of −117 dBc/Hz at an offset frequency of 1 MHz, whereas the coupled type distributed oscillator of the present invention has a phase noise of −125.67 dBc/Hz at an offset frequency of 1 MHz.

From the above, it can be known that the coupled type distributed oscillator according to the present invention has phase noise of −125.67 dBc/Hz at the 1 MHz offset frequency.

In FIG. 5, dotted lines indicate a noise characteristic curve of the coupled type distributed oscillator according to the present invention.

Figure 6:
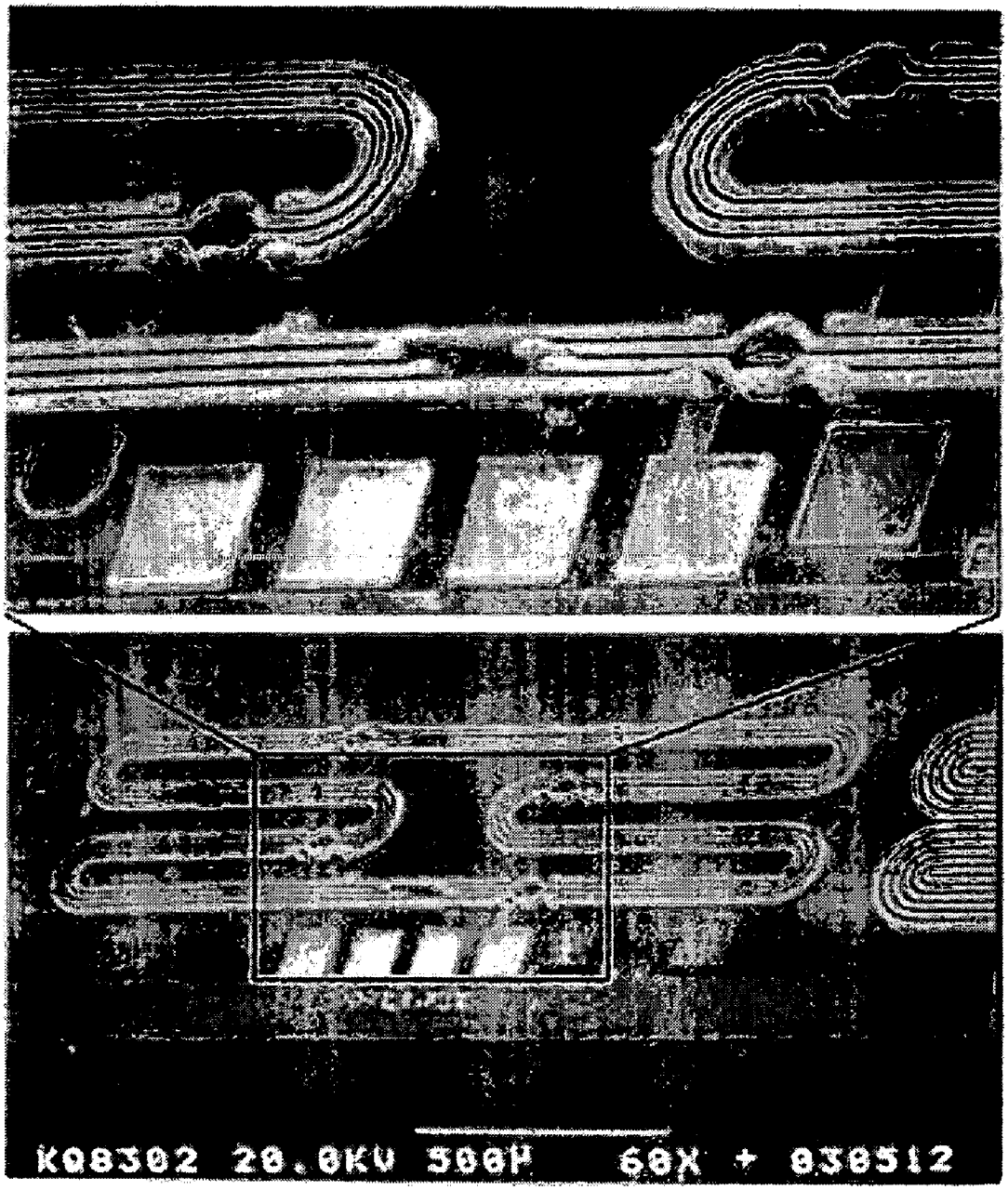
FIG. 6 shows scanning electron microscope (SEM) photography of a coupled type distributed oscillator fabricated by means of micro electro mechanical systems (MEMS).

FIG. 6 shows scanning electron microscope (SEM) photography of a coupled type distributed oscillator fabricated by means of micro electro mechanical systems (MEMS).

In this time, a transmission line of the coupled type distributed oscillator fabricated by means of the MEMS is formed by using a copper layer of 10 μm in thickness, and is spaced from the top of a complementary metal oxide semiconductor (CMOS) circuit by 25 μm.

The coupled type distributed oscillator constructed above can reduce resistance and loss in a substrate.

Table 1 below shows comparison between the properties of the coupled type distributed oscillator according to the present invention and those of the conventional distributed oscillator.

TABLE 1

Comparison between common and coupled type distributed oscillator

| Type | Oscillating frequency (GHz) | Output (dBm) | Phase noise @ 1 MHz | Harmonics (dB) | Power consumption (mW) |
|---|---|---|---|---|---|
| Coupled type distributed oscillator | 15.6 | 0.3 | −124 | −16 | 26 |
| Common distributed oscillator | 13 | −0.8 | −117 (−96.6) | −25 | 26 |

As listed in Table 1, assuming that power consumption is the same, the oscillating frequency of the conventional distributed oscillator is 13 GHz, whereas the oscillating frequency of the coupled type distributed oscillator according to the present invention is 15.6 GHz. Accordingly, it can be seen that the coupled type distributed oscillator according to the present invention is useful in designing a circuit that requires a high frequency.

As described above, according to the present invention, the high frequency coupled type distributed oscillator has an improved frequency tuning characteristic by using the coupled transmission lines. Therefore, the present invention is advantageous in that it can increase the frequency selectivity.

Furthermore, high frequency phase noise can be reduced.

Also, when designing a coupled type distributed oscillator, it is not required that ground lines be formed at both sides of a signal line. It is thus possible to reduce the chip size.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A high frequency distributed oscillator comprising:
   transmission lines being configured to select frequency and to transmit a signal;
   transistors being configured to amplify the signal; and
   a feedback line being configured to feedback the signal being amplified through the transmission lines and the transistors,
   the transmission lines being configured to use coupled transmission lines to increase the frequency selectivity,
   the coupled transmission lines being configured to serve as a filter at a predetermined frequency due to the signal interference one of the coupled transmission lines having a ground line formed only at one end.

2. The high frequency distributed oscillator as claimed in claim 1, wherein
   one of the coupled transmission lines is connected to input terminals of the transistors, and the other of the coupled transmission lines is connected to output terminals of the transistors, and
   the coupled transmission lines and the transistors constitute amplifiers, wherein the amplifiers are connected in series and the number of the amplifiers is at least one.

3. The high frequency distributed oscillator as claimed in claim 1, wherein the coupled transmission lines have the highest signal output at an oscillating frequency.

4. The high frequency distributed oscillator as claimed in claim 1, wherein the transistors are a metal oxide semiconductor field effect transistor or a bipolar junction transistor.

5. A high frequency distributed oscillator comprising:
   transmission lines being configured to select frequency and to transmit a signal;
   transistors being configured to amplify the signal; and
   a feedback line being configured to feedback the signal being amplified through the transmission lines and the transistors,
   the transmission lines being configured to use coupled transmission lines to increase the frequency selectivity,
   the coupled transmission lines being configured to serve as a filter at a predetermined frequency due to the signal interference,
   the oscillator being fabricated by a micro electro mechanical systems.

6. The high frequency distributed oscillator as claimed in claim 5, wherein
   one of the coupled transmission lines is connected to input terminals of the transistors, and the other of the coupled transmission lines is connected to output terminals of the transistors, and
   the coupled transmission lines and the transistors constitute amplifiers, wherein the amplifiers are connected in series and the number of the amplifiers is at least one.

7. The high frequency distributed oscillator as claimed in claim 5, wherein the coupled transmission line has a ground line formed only at one end.

8. The high frequency distributed oscillator as claimed in claim 5, wherein the coupled transmission lines have the highest signal output at an oscillating frequency.

9. The high frequency distributed oscillator as claimed in claim 5, wherein the transistors are a metal oxide semiconductor field effect transistor or a bipolar junction transistor.

* * * * *